(12) United States Patent
Leuschner et al.

(10) Patent No.: US 7,697,322 B2
(45) Date of Patent: Apr. 13, 2010

(54) INTEGRATED CIRCUITS; METHOD FOR MANUFACTURING AN INTEGRATED CIRCUIT; METHOD FOR DECREASING THE INFLUENCE OF MAGNETIC FIELDS; MEMORY MODULE

(75) Inventors: Rainer Leuschner, Regensburg (DE); Ulrich Klostermann, Munich (DE)

(73) Assignees: Qimonda AG, Munich (DE); ALTIS Semiconductor, SNC, Corbeil Essonnes Cedex (FR)

( * ) Notice: Subject to any disclaimer, the term of this patent is extended or adjusted under 35 U.S.C. 154(b) by 259 days.

(21) Appl. No.: 11/775,599

(22) Filed: Jul. 10, 2007

(65) Prior Publication Data

US 2009/0016096 A1    Jan. 15, 2009

(51) Int. Cl.
*G11C 11/00* (2006.01)
(52) U.S. Cl. .................. 365/158; 365/148; 365/171
(58) Field of Classification Search .................. 365/158, 365/148, 171
See application file for complete search history.

(56) References Cited

U.S. PATENT DOCUMENTS

| 6,654,279 | B2* | 11/2003 | Nishimura | 365/173 |
| 6,909,130 | B2* | 6/2005 | Yoda et al. | 257/295 |
| 7,577,021 | B2* | 8/2009 | Guo et al. | 365/158 |
| 2007/0063237 | A1* | 3/2007 | Huai et al. | 257/295 |
| 2008/0140922 | A1* | 6/2008 | Higo et al. | 711/105 |

\* cited by examiner

*Primary Examiner*—Tuan T. Nguyen
(74) *Attorney, Agent, or Firm*—Slater & Matsil, L.L.P.

(57) ABSTRACT

Embodiments of the invention relate generally to integrated circuits, to a method for manufacturing an integrated circuit, to a method for decreasing the influence of magnetic fields, and to a memory module. In an embodiment of the invention, an integrated circuit having a magnetic tunnel junction is provided. The magnetic tunnel junction may include a free layer with a magnetization orientation that is selected by the application of a write current through the magnetic tunnel junction, and a retention layer that retains the selectable magnetization orientation of the free layer at temperatures below a retention temperature.

24 Claims, 5 Drawing Sheets

US 7,697,322 B2

INTEGRATED CIRCUITS; METHOD FOR MANUFACTURING AN INTEGRATED CIRCUIT; METHOD FOR DECREASING THE INFLUENCE OF MAGNETIC FIELDS; MEMORY MODULE

TECHNICAL FIELD

Embodiments of the invention relate generally to integrated circuits, to a method for manufacturing an integrated circuit, to a method for decreasing the influence of magnetic fields, and to a memory module.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

Embodiments of the present invention relate generally to MRAM (Magneto-resistive Random Access Memory) devices. A typical MRAM array is made up of memory cells, each of which includes a magnetic tunnel junction (MTJ) including two magnetic layers separated by a non-magnetic layer. These magnetic layers are commonly referred to as a "fixed" layer, in which the direction of magnetization is fixed, and a "free" layer, in which the direction of magnetization may be switched. The resistance of an MTJ varies based on the relative directions of magnetization of these layers. For example, when the directions of magnetization of the fixed and free layers are parallel, the resistance may be relatively small (typically representing a logical "0"), and may become greater when the directions of magnetization are anti-parallel (typically representing a logical "1").

In one common type of MRAM, to switch the direction of magnetization of the free layer of a particular cell, currents are applied through a bit line and a word line that intersect at that cell. The combined magnitude of the currents through the word and bit lines generate a magnetic field at their intersection that is strong enough to switch the direction of magnetization of the free layer of the selected cell. In another conventional type of MRAM, known as "spin torque" MRAM, instead of applying magnetic fields via the bit and word lines, the direction of magnetization of the free layer is switched by passing a spin-polarized current through the MTJ of the selected cell.

In order to construct high density magnetic memories, it is desirable for the cell size to be small. Because spin torque MRAM uses write currents that are typically lower than those used for generating a magnetic field sufficient for writing, smaller cell size can be achieved. This makes spin torque switching well suited for use in high density MRAM devices. Unfortunately, small cell size may also lead to poor stability of magnetization, which can cause increased errors in storing data.

Figure 1:
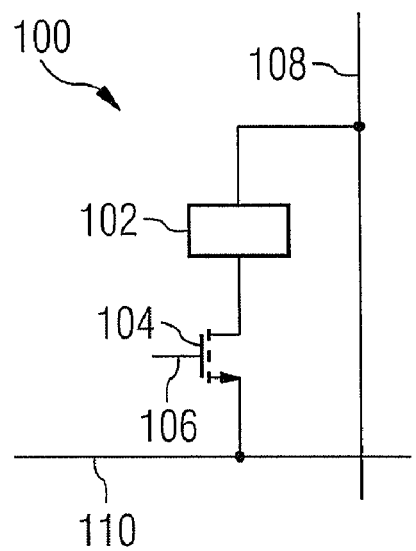
FIG. 1 shows a cell of a spin torque MRAM device.

FIG. 1 shows a cell of a spin torque MRAM device. A spin torque MRAM cell 100 includes a magnetic tunnel junction (MTJ) 102, which is connected in series with a select transistor 104 (note that as used herein the terms connected and coupled are intended to include both direct and indirect connection and/or coupling, respectively). A word line (not shown) is used to select the cell by controlling the select line 106 of the transistor 104. When writing, current is driven through the MTJ 102 through a bit line 108, which is connected to the MTJ 102 and a common line 110, which is connected to the transistor 104. The value written in the MTJ 102 is determined by the spin polarization of the critical current. When reading, the same selection mechanism is employed, a sub-critical current (which may be below about 50% of the critical current) is applied through the MTJ 102, and the bit line 108 and common line 110 are used to sense the resistance of the MTJ 102.

Figure 2:
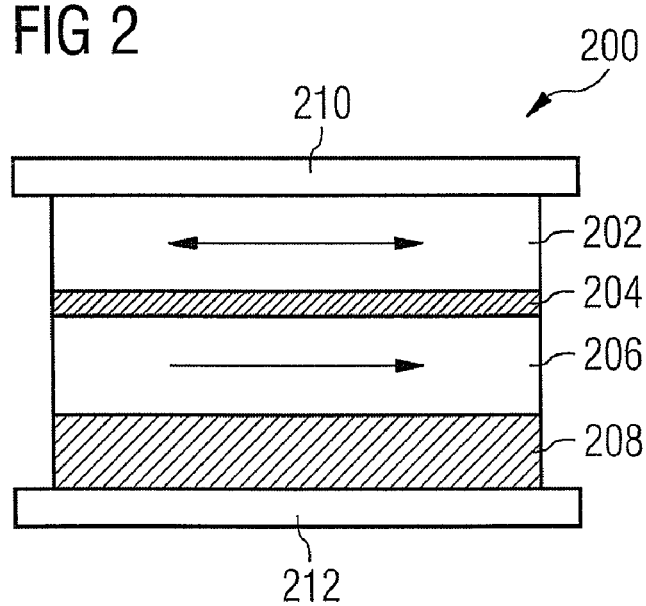
FIG. 2 shows the structure of a conventional magnetic tunnel junction (MTJ) for use with a spin torque MRAM device.

FIG. 2 shows the structure of a conventional MTJ for use in a spin torque MRAM. The MTJ 200 includes a free layer 202, a barrier layer 204, a fixed layer 206 and an antiferromagnetic layer 208. The fixed layer 206 and free layer 202 are typically ferromagnetic, with the fixed layer 206 having a fixed orientation of magnetization, and the free layer 202 having an orientation of magnetization that can be rotated in response to the spin polarization of a current that is driven through the MTJ 200. In an embodiment of the invention, the antiferromagnetic layer 208 is used to fix (or "pin") the orientation of magnetization of the fixed layer 206. The barrier layer 204 is typically nonmagnetic, and is thin enough to permit tunneling of electrons through the barrier layer 204 in the conventional MTJ 200. Also shown are a top contact 210 and a bottom contact 212, which are used to drive current through the MTJ 200.

The resistance of the MTJ 200 varies according to the relative orientations of magnetization of the fixed layer 206 and the free layer 202. When the orientation of magnetization of the free layer 202 is parallel to the orientation of magnetization of the fixed layer 206, then the resistance of the MTJ 200 is low. The resistance of the MTJ 200 becomes higher when the orientation of magnetization of the free layer 202 is antiparallel to the orientation of magnetization of the fixed layer 206. These low and high resistance states can be used to represent a logical "0" or a logical "1" stored in the MTJ 200.

Spin torque switching, such as is described above, is advantageous for use with small MRAM cells, because the write current levels that are required for such switching are lower than the current levels that would be required by many other conventional methods of writing to an MRAM, such as using a field generating current. In a spin torque MRAM, the size of the selection transistor is determined by the current that is required for writing, and can dominate the cell size. It is, therefore, desirable to have a low write current, so that the size of the selection transistor is minimized. By decreasing the cell size, it is possible to increase the density of the cells in an MRAM array, to create larger capacity MRAM devices.

The critical spin torque current, which is needed for spin torque switching, is proportional to (this holds true for the in-plane embodiment, i.e., in an embodiment, in which the magnetic orientations are substantially parallel to the plane defined by the interface between the two magnetic layer structures):

$$I_c \sim M_s^2 \cdot V + E_a.$$

Where:
$I_c$ is the critical spin torque current;
$M_s$ is the saturation magnetization;
V is the volume of the free layer; and
$E_a$ is the activation energy at zero field/current.

As can be seen from this, a small cell (in which the volume of the free layer is small) will have a low critical spin torque current, and can also use a small selection transistor.

In an embodiment of the invention, where the magnetic orientations are substantially perpendicular to the plane defined by the interface between the two magnetic layer structures, the critical spin torque current, which is needed for spin torque switching, is proportional to:

$$I_c \sim E_a.$$

Unfortunately, the stability of the magnetization is also related to the size of the cell, and is proportional to the activation energy $E_a$, which may be computed as:

$$E_a = \frac{1}{2} \cdot M_s \cdot V \cdot H_c$$

Where:
$E_a$ is the activation energy at zero field/current;
$M_s$ is the saturation magnetization;
V is the volume of the free layer; and
$H_c$ is the magnitude of a critical field preventing magnetization reversal.

Thus, when the size of the cell is small (i.e., V is small), the stability of the magnetization may be low. The magnetization stability of an MRAM device is also its information stability, so a low magnetization stability means that errors and information loss are more likely, which is undesirable in a memory device. Partially as a result of this difficulty, spin torque switching has had limited use in commercial MRAM devices.

One conventional approach to addressing this difficulty is to provide an MTJ with a thin free layer and a high aspect ratio. Such an MTJ can have a high critical field, $H_c$ (and, therefore, a high activation energy, $E_a$, and information stability), with a relatively low critical spin torque current, $I_c$. Unfortunately, due to the high aspect ratio of the free layer, the cell size is increased, making it difficult to achieve a desirable density.

Figure 3:
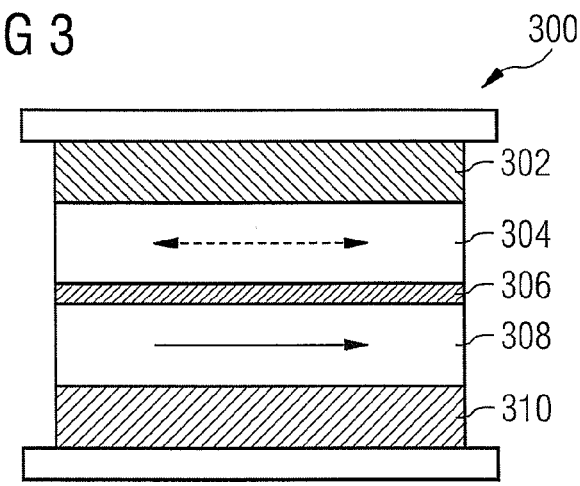
FIG. 3 shows the structure of an MTJ in accordance with one embodiment of the invention.

In an embodiment of the invention, other approaches can be used to provide a relatively small MRAM cell using spin torque switching, while providing high information stability. FIG. 3 shows an embodiment of an MTJ 300, which includes an antiferromagnetic pinning layer 302 as an embodiment of a retention layer adjacent to a free layer 304. The free layer 304 is separated from a fixed layer 308 by a barrier layer 306. The magnetization of the fixed layer 308 is pinned by an antiferromagnetic layer 310.

These layers may be composed of a variety of materials. Generally, the free layer 304 and the fixed layer 308 contain ferromagnetic metals, such as Fe, Co, Ni, Tb, Cu, Pt, or various alloys of such metals. Alternatively, other ferromagnetic materials, such as the Heusler alloys NiMnSb, PtMnSb, $CO_2MnSi$, or oxides such as $Fe_3O_4$ or $CrO_2$ may be used. In an embodiment of the invention, the free layer 304 and the fixed layer 308 may include multilayer sheets, e.g. including a multilayer structure $[Ni/Co/Ni/Co]_n$ or $[Co/Pt/Co/Pt]_n$, wherein n is an index indicating the number of a respective multilayer structure. In another embodiment of the invention, the free layer 304 and the fixed layer 308 may include CoTbFe alloys. In some embodiments, the fixed layer 308 may be replaced by an artificial antiferromagnet (AAF), including alternating ferromagnetic and non-magnetic layers having an exchange coupling such that in the absence of an external magnetic field, the magnetization directions of the ferromagnetic layers are antiparallel. The barrier layer 306 contains an insulating material, such as $Al_2O_3$, or another barrier oxide, such as $SrTiO_3$, $TiO_2$, MgO, or $CeO_2$. The antiferromagnetic pinning layer 302 and antiferromagnetic layer 310 may be natural antiferromagnets, including materials such as FeMn, NiMn, PtMn, IrMn, $RhMn_3$, $Ir_{20}Mn_{80}$, $Pd_{52}Pt_{18}Mn_{50}$, NiO, $\alpha$-$Fe_2O_3$, or a-$Tb_{25}Co_{75}$. Alternatively, one or both of the antiferromagnetic pinning layer 302 and antiferromagnetic layer 310 may include an artificial antiferromagnet, composed, for example, of alternating layers of ferromagnetic and non-magnetic materials.

The antiferromagnetic pinning layer 302 has a relatively low blocking temperature, and serves to pin the orientation of magnetization of the free layer 304, providing additional magnetization stability at room temperature. At temperatures below the blocking temperature of the antiferromagnetic pinning layer 302, the critical field, $H_c$, of the free layer 304 is enhanced by an exchange bias field, $H_{ex}$, due to the antiferromagnetic pinning layer 302. The enhanced exchange bias field $H_{ex}$ results in an enhanced thermal stability factor $E_a$, which is expressed by the formal introduction of an effective exchange bias field $H_{ex\_eff}$. Therefore, at temperatures below the blocking temperature of the antiferromagnetic pinning layer 302, the activation energy (which is related to the stability of magnetization) can be expressed as:

$$E_a = \frac{1}{2} \cdot M_s \cdot V \cdot (H_c + H_{ex\_eff})$$

Where:
$E_a$ is the activation energy at zero field/current;
$M_s$ is the saturation magnetization;
V is the volume of the free layer;
$H_c$ is the magnitude of a critical field preventing magnetization reversal; and
$H_{ex\_eff}$ is the effective exchange bias field.

It turns out that at temperatures where the exchange bias field is present, the stability of magnetization of the free layer 304 may be significantly enhanced. Thus, the exchange pinning field will give rise to an effective exchange bias field which is defined by the above equation. At higher temperatures, above the blocking temperature of the antiferromagnetic pinning layer 302, the effective exchange bias field, $H_{ex\_eff}$, will be absent, and the critical spin torque current, $I_c$, will be substantially unaffected by the antiferromagnetic pinning layer 302.

When current is applied through the MTJ 300, such as when a spin polarized current is used to write a value to the MTJ 300, the current will cause heating of the MTJ 300, due to the resistance of the barrier layer. This heating may be sufficient to reach the blocking temperature of the antiferromagnetic pinning layer 302. For a natural antiferromagnet, for example, the blocking temperature will depend on the material chosen for the antiferromagnetic pinning layer 302 and the thickness of the layer. Thus, for a natural antiferromagnetic material used in the antiferromagnetic pinning layer 302, the blocking temperature can be tailored to a convenient value by adjusting the thickness of the material. For instance, if IrMn is used for the antiferromagnetic pinning layer 302, a thickness of 3 nm will provide a blocking temperature of 160° C., which is sufficiently high to ensure that the cells are pinned at room temperature or operating temperature, but low enough to be reached by the heat generated by the application of a normal spin torque write current of less than 100 mA/µm². Because the fixed layer 308 should continue to be pinned by the antiferromagnetic layer 310, the blocking temperature of the antiferromagnetic layer 310 should be set higher than the temperature that will be reached through application of a writing current. This can be achieved, for example, through the use of a natural antiferromagnetic material having a higher blocking temperature, such as PtMn, and by selecting an appropriate thickness such as, e.g., a layer thickness of about 20 nm.

In an embodiment of the invention, by using an arrangement for an MTJ such as is shown in FIG. 3, the critical writing current for spin torque writing, $I_c$, can be reduced without a loss of information stability. By reducing the critical writing current, the size of the select transistor, and of the entire memory cell can be reduced, providing a higher density MRAM device.

Figure 4:
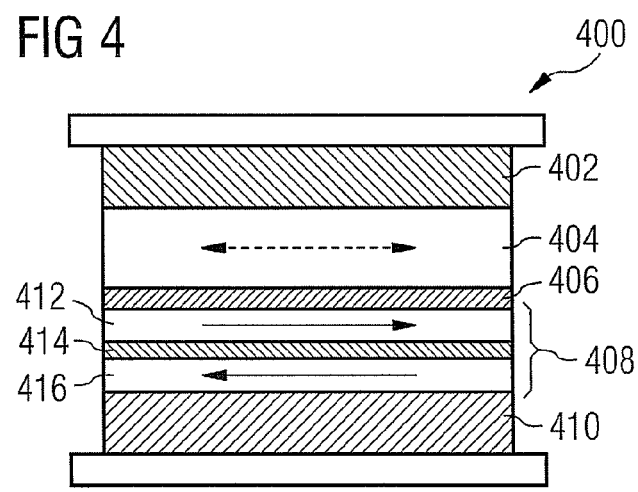
FIG. 4 shows the structure of an MTJ in accordance with an alternative embodiment of the invention.

FIG. 4 shows an alternative embodiment of an MTJ applying the principles of the invention. As shown in FIG. 4, an MTJ 400 includes an antiferromagnetic pinning layer 402, which has a relatively low blocking temperature, suitable for pinning the magnetization orientation of a free layer 404 at room temperature. The free layer 404 is separated from an artificial antiferromagnetic layer 408 by a barrier layer 406. The artificial antiferromagnetic layer 408 serves a similar purpose to a fixed layer, and is pinned by a antiferromagnetic layer 410, having a relatively high blocking temperature.

The artificial antiferromagnetic layer 408 includes a first ferromagnetic layer 412 with a magnetization orientation that is antiparallel to a second ferromagnetic layer 416. The first ferromagnetic layer 412 is separated from the second ferromagnetic layer 416 by a nonmagnetic layer 414, with a thickness selected to facilitate antiferromagnetic interlayer exchange between the first ferromagnetic layer 412 and the second ferromagnetic layer 416. Alternatively, other designs for the artificial antiferromagnetic layer 408, including multiple ferromagnetic and nonmagnetic layers may be used.

As in the embodiment described with reference to FIG. 3, the thickness and material of the antiferromagnetic pinning layer 402 may be selected to provide a blocking temperature that permits the antiferromagnetic pinning layer 402 to pin the free layer 404 at room temperature or operating temperature, but to have little or substantially no effect on the free layer 404 at a temperature that will be reached during writing of the MTJ 400. This provides high information stability in a small, low write current MRAM memory cell. This high information stability may obviate previous difficulties with spin torque MRAM cells, and increase the ability to use memory cells that are switched by a spin torque effect. In an embodiment of the invention, such memory cells may have a simplified layout compared to some other MRAM designs, such as those that use a magnetic field for switching. In an embodiment of the invention, neither word lines nor bit lines for the field generation are required as for a conventional thermal select scheme.

Figure 6:
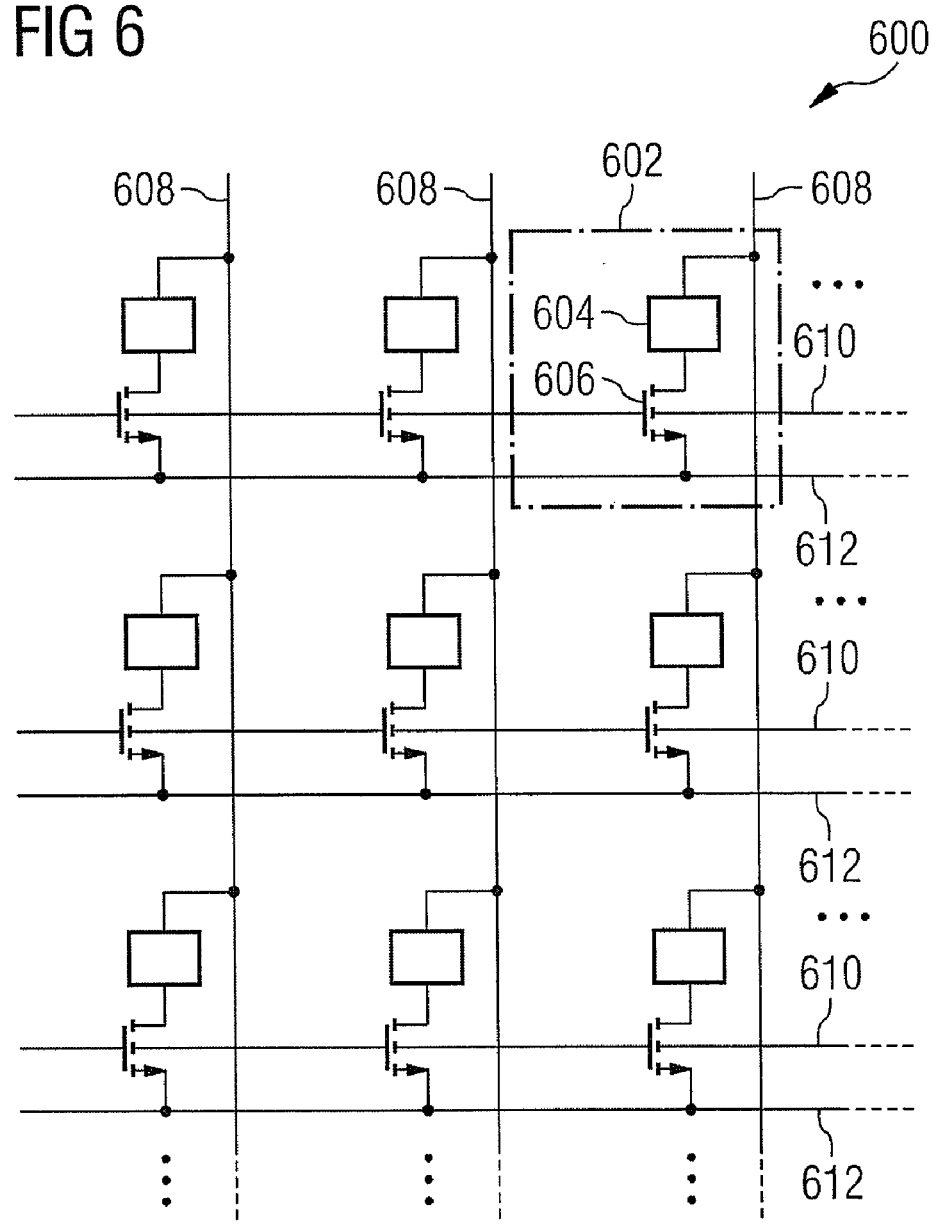
FIG. 6 shows the layout of a conventional spin torque MRAM array.

Another source of information stability and switching difficulties in a spin torque MRAM device is the magnetic field fluctuations caused by nearby cells in a memory array. This problem is especially acute when the cell size is small, and the density of cells is high. FIG. 6 shows a block diagram of a conventional spin torque MRAM memory array. The memory array 600 includes numerous cells 602, each of which includes an MTJ 604 and a select transistor 606. Each of the cells 602 is connected to a bitline 608 and wordline 610, which select an individual cell in the array. Each of the cells 602 is also connected to a common line 612, which may be connected to ground, or to other circuitry, such as circuitry for measuring the resistance of a selected cell for the purpose of reading or writing.

Generally, the switching probability for a spin torque MTJ in a memory array will depend to some degree on the field generated by neighboring cells, which will depend on the information stored in the neighboring cells. To overcome the effects of the field generated by neighboring cells, the write current may need to be increased. This increased write current may lead to use of larger selection transistors and, therefore, larger cell size. Additionally, a field generated by neighboring cells may lead to difficulties with information stability when the activation energy, $E_a$, is low, such as when a small cell size is used. As discussed above, however, a small cell size is highly desirable to increase the density of an array of cells and the storage capacity of MRAM devices.

In accordance with an embodiment of the invention, a screened free layer, such as is described above with reference to FIG. 5 may be used to address difficulties with information stability due to a field generated by neighboring cells.

Figure 5:
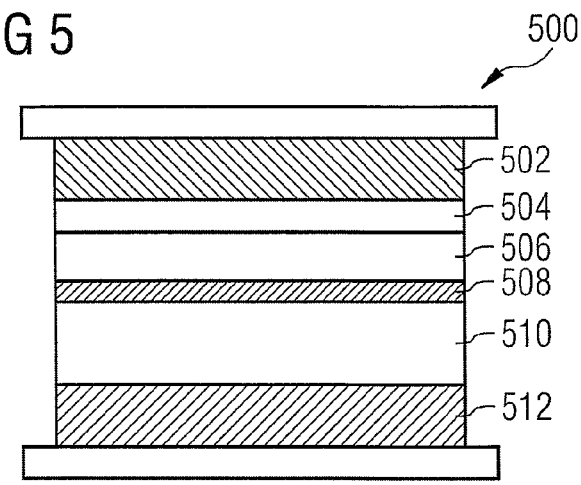
FIG. 5 shows the structure of an MTJ in accordance with another alternative embodiment of the invention.

Referring now to FIG. 5, another alternative embodiment of an MTJ in accordance with the invention is described. In this embodiment, an MTJ 500 includes a screening layer 502 as another embodiment of a retention layer, a spacer layer 504, also referred to as a decoupling layer 504, which may be made of at least one of the following materials: Ru, Al, Ta, Ti, Rh, Re, Al2O3, MgO, etc., or a combination or an alloy of at least two of the mentioned materials, a free layer 506, a barrier layer 508, a fixed layer 510, and a pinning layer 512. In the embodiment shown in FIG. 5, the free layer 506 includes one ferromagnetic layer. Other configurations of the free layer 506 may include multiple alternating layers of ferromagnetic and nonmagnetic materials.

The screening layer 502 includes a ferromagnetic material that is magnetically coupled in an anti-parallel orientation with the free layer 506 via the spacer layer 504. In an embodiment of the invention, the screening layer 502 includes a ferromagnetic material having a low Curie temperature, such that the spin torque writing current will heat the cell beyond the Curie temperature of the material during writing, so that the magnetic moment of the screening layer 502 will effectively vanish, having substantially no effect on the switching of the free layer 506. Illustratively, the free layer moment is counter balanced with another layer, e.g., the screening layer 502 that is coupled strongly anti-parallel to the free layer 506 (similar to an antiferromagnetic structure). In an embodiment of the invention, a ferromagnetic material with a low Curie temperature (Tc) is used for the screening layer 502, because the spin torque current also heats the memory cell and if the Curie temperature (Tc) is reached, the moment of the screening layer 502 will vanish and the screening layer 502 would not disturb the switching of the free layer 506.

Figure 7:
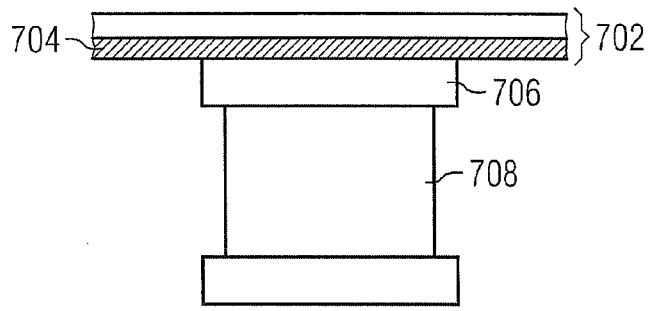
FIG. 7 shows a bit line reducing the effects of magnetic fields generated by neighboring memory cells in an MRAM array, in accordance with an embodiment of the invention.

Additionally, in some embodiments in accordance with the invention, a magnetic material may be incorporated at the bottom of bit lines, to reduce the effects of the field generated by neighboring cells. Such an embodiment is illustrated in FIG. 7, in which a bit line 702 connects to a top contact 706 of an MTJ 708. The bit line 702 includes a bottom portion 704, which may include a soft magnetic material that is polarized in that way that the resulting magnetization of the bottom portion 704 reduces the effect of the field generated by neighboring cells. In an embodiment of the invention, magnetic dipole fields will be screened away by inducing magnetic mirror charges (quasi domains) in the adjacent magnetic bit line. The bottom portion 704 may include magnetic materials such as NiFe, CoFeB, or Zr based magnetic alloys.

It will be understood that a bit line incorporating a magnetic material, such as the bit line 702 with the bottom portion 704 shown in FIG. 7, may be used in combination with an MTJ having a screened free layer, such as is discussed above with reference to FIG. 5, or with other MTJ or magnetic memory cell designs.

Figure 8A:
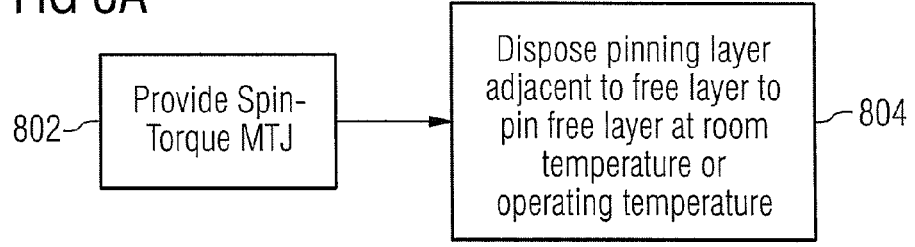
FIG. 8A shows a method of providing a spin torque MTJ with high information stability, in accordance with one embodiment of the invention.

FIG. 8A shows a method for providing a spin torque MTJ with high information stability according to an embodiment of the invention. In 802, a spin torque MTJ is provided, having a fixed layer, a barrier layer, and a free layer. In 804, a pinning layer is disposed adjacent to the free layer, so that the free layer is pinned at temperatures below a blocking temperature. In an embodiment of the invention, the pinning temperature is above room temperature or operating temperature, so the free layer is pinned at room temperature or operating temperature, and is free to change its magnetization orientation at a temperature that is reached in the MTJ when a write current is applied.

If the pinning layer includes a natural antiferromagnet, then the material and thickness of the natural antiferromagnet should be selected so that its pinning temperature will be above room temperature or the operating temperature of the memory cell (which may be in the range from about 0° C. to about 80° C.), but at or below a temperature that is reached in the MTJ when a current sufficient for writing data to the MTJ is applied. For a natural antiferromagnet, the pinning temperature is the blocking temperature of the natural antiferromagnet.

Figure 8B:
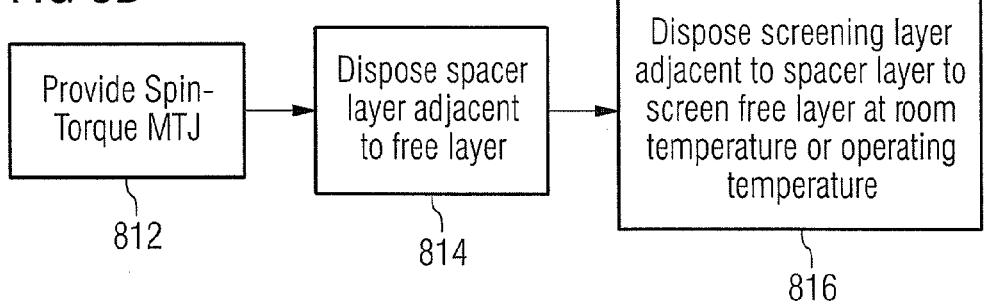
FIG. 8B shows a method of providing a spin torque MTJ with high information stability, in accordance with another embodiment of the invention.

FIG. 8B shows a method for providing a spin torque MTJ with high information stability according to an embodiment of the invention. In 812, a spin torque MTJ is provided, having a fixed layer, a barrier layer, and a free layer. In 814, a spacer layer is disposed adjacent to the free layer. Furthermore, in 816, a screening layer is disposed adjacent to the spacer layer so that the free layer is screened at temperatures below a screening temperature. In an embodiment of the invention, the screening temperature is above room temperature or operating temperature, so the free layer is pinned at room temperature or operating temperature, and is free to change its magnetization orientation at a temperature that is reached in the MTJ when a write current is applied. In an embodiment of the invention, the screening temperature is the Curie temperature of the material of the screening layer.

Figure 9:
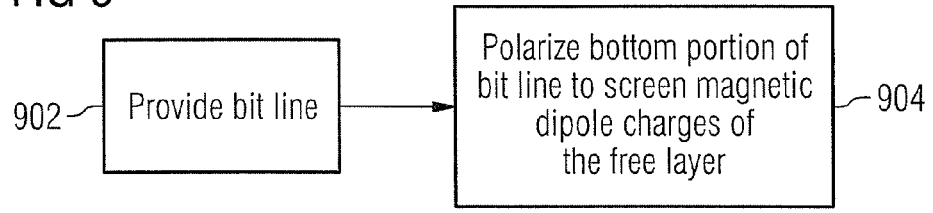
FIG. 9 shows a method of decreasing the influence of magnetic fields generated by neighboring memory cells in an MRAM array, in accordance with an embodiment of the invention.

FIG. 9 shows a method in accordance with another embodiment of the invention, for decreasing the influence of magnetic fields generated by neighboring memory cells. In step 902, a bit line is provided, having a bottom portion that connects to a top contact of a memory cell, and that incorporates a magnetic material. Next, in step 904, the bottom portion is polarized in a way to reduce the effect of the field generated by neighboring memory cells.

In summary, in one embodiment, a magnetic tunnel junction is provided that includes a free layer with a magnetization orientation that is selected by the application of a write current through the magnetic tunnel junction, and a screening layer that screens the selectable magnetization orientation of the free layer at temperatures below a screening temperature. In some embodiments, the write current includes a spin polarized write current, wherein the spin polarization of the write current determines the magnetization orientation of the free layer. In some embodiments, application of the write current heats the screening layer to a temperature above the screening temperature. In some embodiments, the screening temperature is higher than room temperature or the operating temperature of the memory cell (e.g., in the range from about 0° C. to about 80° C.

In some embodiments, the screening layer includes an antiferromagnetic material, and the screening temperature is a blocking temperature of the antiferromagnetic material. In certain such embodiments, the antiferromagnetic material includes a natural antiferromagnetic material.

In other embodiments, the screening layer includes a ferromagnetic material that is magnetically coupled in an anti-parallel orientation with the free layer, and the screening vanishes at the Curie temperature of the ferromagnetic material.

In some embodiments, the magnetic tunnel junction also includes a fixed layer having a fixed magnetization orientation, and a barrier layer disposed between the fixed layer and the free layer. In certain such embodiments, the fixed layer includes an artificial antiferromagnet. In some embodiments, the barrier layer includes an insulating material that heats the magnetic tunnel junction when a write current is applied to the magnetic tunnel junction. In some of these embodiments, the magnetic tunnel junction is heated to a temperature above the retention temperature when the write current is applied to the magnetic tunnel junction.

In an embodiment of the invention, a magnetic tunnel junction is provided for use in an MRAM device, including switchable magnetic means for storing information based on a magnetization orientation of the switchable magnetic means, and temperature-sensitive retention means for retaining the magnetization orientation of the switchable magnetic means when the temperatures is below a retention temperature. In some embodiments, the switchable magnetic means includes a free layer having a magnetization orientation determined by the spin polarization of a write current that is applied to the magnetic tunnel junction. In some embodiments, the magnetic tunnel junction includes heating means for heating the temperature-sensitive screening means to a temperature above the retention temperature when a write current is applied to the magnetic tunnel junction.

In some embodiments, the temperature-sensitive retention means includes a pinning means including a natural antiferromagnetic material, and the pinning temperature is a blocking temperature of the natural antiferromagnetic material.

In other embodiments, the temperature-sensitive retention means includes screening means including a ferromagnetic material that is magnetically coupled in an anti-parallel orientation with the free layer, and the screening temperature range for coupling is given by the Curie temperature of the ferromagnetic material.

In yet another embodiment, a method is provided for manufacturing a magnetic tunnel junction, including providing a magnetic tunnel junction having a free layer with a spin torque selectable magnetization orientation, and providing a retention layer that retains the magnetization orientation of the free layer at temperatures below a retention temperature. In some embodiments, providing the retention layer includes providing a retention layer having a screening temperature that is above room temperature or operating temperature, and below a temperature that is reached by the retention layer when a write current is applied to the magnetic tunnel junction.

In some embodiments, providing the retention layer includes providing a pinning layer including an antiferromagnet, and the pinning temperature is the blocking temperature of the antiferromagnet. In some of these embodiments, providing an antiferromagnet includes providing a natural antiferromagnet.

In other embodiments, providing the retention layer includes providing a screening layer including a ferromagnetic material that is magnetically coupled in an anti-parallel orientation with the free layer, and the screening temperature range for coupling is given by the Curie temperature of the ferromagnetic material.

In another embodiment of the invention, a bit line for use in an MRAM device is provided, the bit line having a bottom portion including a magnetic material that is configured to screen the magnetic dipole fields of the free layer. In some embodiments, the magnetic material may include a soft ferromagnetic material. In some embodiments, the bit line is connected to a spin torque magnetic tunnel junction.

In another embodiment of the invention, a method for decreasing the influence of magnetic fields generated by neighboring memory cells in an MRAM array is provided, by providing a bit line for use in selecting a memory cell in an MRAM array, the bit line having a bottom portion including a magnetic material that is polarized in a direction such that it can screen the magnetic dipole fields of the free layer.

Figure 10A:
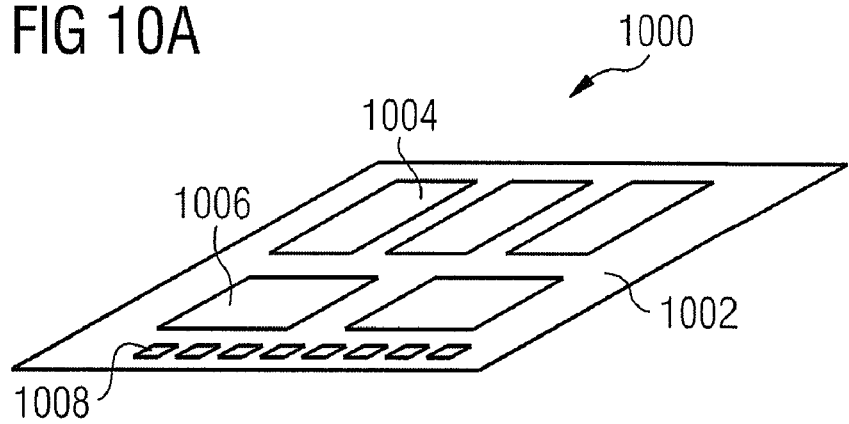
FIGS. 10A and 10B show a memory module (FIG. 10A) and a stackable memory module (FIG. 10B) in accordance with an embodiment of the invention.
Figure 10B:
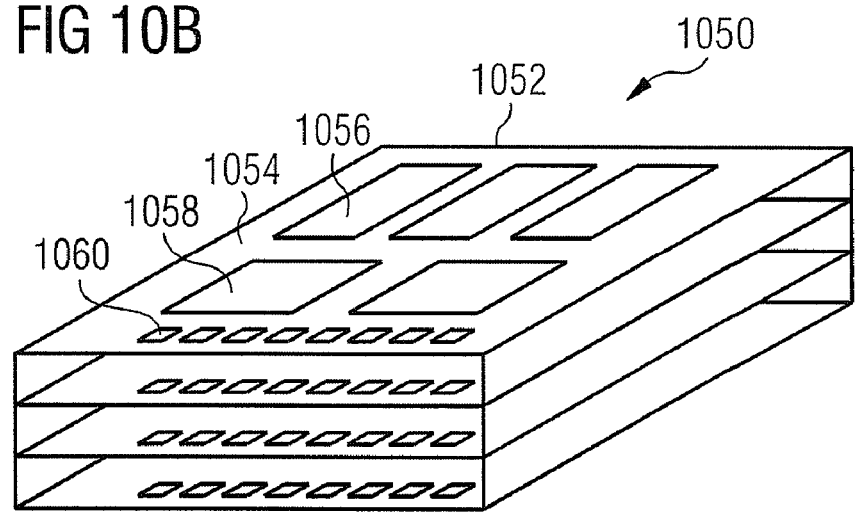

As shown in FIGS. 10A and 10B, in some embodiments, memory devices such as those described herein may be used in modules.

In FIG. 10A, a memory module 1000 is shown, on which one or more memory devices 1004 are arranged on a substrate 1002. The memory device 1004 may include numerous memory cells, each of which uses a memory element in accordance with an embodiment of the invention. The memory module 1000 may also include one or more electronic devices 1006, which may include memory, processing circuitry, control circuitry, addressing circuitry, bus interconnection circuitry, or other circuitry or electronic devices that may be combined on a module with a memory device, such as the memory device 1004. Additionally, the memory module 1000 includes multiple electrical connections 1008, which may be used to connect the memory module 1000 to other electronic components, including other modules.

As shown in FIG. 10B, in some embodiments, these modules may be stackable, to form a stack 1050. For example, a stackable memory module 1052 may contain one or more memory devices 1056, arranged on a stackable substrate 1054. The memory device 1056 contains memory cells that employ memory elements in accordance with an embodiment of the invention. The stackable memory module 1052 may also include one or more electronic devices 1058, which may include memory, processing circuitry, control circuitry, addressing circuitry, bus interconnection circuitry, or other circuitry or electronic devices that may be combined on a module with a memory device, such as the memory device 1056. Electrical connections 1060 are used to connect the stackable memory module 1052 with other modules in the stack 1050, or with other electronic devices. Other modules in the stack 1050 may include additional stackable memory modules, similar to the stackable memory module 1052 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit having a magnetic tunnel junction, the magnetic tunnel junction comprising:
   a free layer with a magnetization orientation that is selected by an application of a write current through the magnetic tunnel junction; and
   a retention layer that retains a selectable magnetization orientation of the free layer at temperatures below a retention temperature.

2. The integrated circuit of claim 1, wherein the retention layer comprises a pinning layer comprising an antiferromagnetic material, and the retention temperature comprises a blocking temperature of the antiferromagnetic material.

3. The integrated circuit of claim 2, wherein the antiferromagnetic material comprises a natural antiferromagnetic material.

4. The integrated circuit of claim 1, wherein the retention layer comprises a screening layer comprising a ferromagnetic material that is magnetically coupled in an anti-parallel orientation with the free layer, and the retention temperature comprises a Curie temperature of the ferromagnetic material.

5. The integrated circuit of claim 1, wherein application of the write current heats the retention layer to a temperature above the retention temperature.

6. The integrated circuit of claim 1, wherein the write current comprises a spin polarized write current, the spin polarization of the write current determining the magnetization orientation of the free layer.

7. The integrated circuit of claim 1, further comprising:
   a fixed layer having a fixed magnetization orientation, and a barrier layer disposed between the fixed layer and the free layer.

8. The integrated circuit of claim 7, wherein the fixed layer comprises an artificial antiferromagnet.

9. The integrated circuit of claim 7, wherein the barrier layer comprises an insulating material that heats the magnetic tunnel junction when the write current is applied to the magnetic tunnel junction.

10. The integrated circuit of claim 9, wherein the magnetic tunnel junction is heated to a temperature above the retention temperature when the write current is applied to the magnetic tunnel junction.

11. The integrated circuit of claim 1, wherein the retention temperature is higher than room temperature or operating temperature.

12. An integrated circuit having a magnetic tunnel junction, the magnetic tunnel junction comprising:
   switchable magnetic means for storing information based on a magnetization orientation of the switchable magnetic means; and temperature-sensitive retention means for retaining the magnetization orientation of the switchable magnetic means when the temperature is below a retention temperature.

13. The integrated circuit of claim 12, wherein the temperature-sensitive retention means comprises a pinning means comprising a natural antiferromagnetic material, and the retention temperature comprises a blocking temperature of the natural antiferromagnetic material.

14. The integrated circuit of claim 12, wherein the temperature-sensitive retention means comprises a screening means comprising a ferromagnetic material that is magnetically coupled in an anti-parallel orientation with a free layer, and the retention temperature comprises a Curie temperature of the ferromagnetic material.

15. The integrated circuit of claim 12, further comprising:
heating means for heating the temperature-sensitive retention means to a temperature above the retention temperature when a write current is applied to the magnetic tunnel junction.

16. The integrated circuit of claim 12, wherein the switchable magnetic means comprises a free layer having a magnetization orientation determined by a spin polarization of a write current that is applied to the magnetic tunnel junction.

17. The integrated circuit of claim 12, wherein the retention temperature is higher than room temperature or operating temperature.

18. A method of operating an integrated circuit, the method comprising:
providing an integrated circuit that comprises a magnetic tunnel junction with a free layer and a retention layer;
selecting a magnetization orientation of the free layer by applying a write current through the magnetic tunnel junction, wherein the retention layer retains the selected magnetization orientation of the free layer at temperatures below a retention temperature.

19. The method of claim 18, wherein applying the write current heats the retention layer to a temperature above the retention temperature.

20. The method of claim 18, wherein the write current comprises a spin polarized write current, the spin polarization of the write current determining the magnetization orientation of the free layer.

21. The method of claim 18, wherein the integrated circuit further comprises a fixed layer having a fixed magnetization orientation and a barrier layer disposed between the fixed layer and the free layer, wherein the barrier layer comprises an insulating material that heats the magnetic tunnel junction when a write current is applied to the magnetic tunnel junction.

22. The method of claim 21, wherein the magnetic tunnel junction is heated to a temperature above the retention temperature when the write current is applied to the magnetic tunnel junction.

23. A memory module, comprising:
a plurality of integrated circuits, wherein at least one integrated circuit of the plurality of integrated circuits comprises a magnetic tunnel junction, the magnetic tunnel junction comprising:
a free layer with a magnetization orientation that is selected by application of a write current through the magnetic tunnel junction; and
a retention layer that retains selectable magnetization orientation of the free layer at temperatures below a retention temperature.

24. The memory module of claim 23, wherein the memory module is a stackable memory module in which at least some of the integrated circuits are stacked one above the other.

* * * * *